US009766745B2

(12) United States Patent
Hotelling et al.

(10) Patent No.: US 9,766,745 B2
(45) Date of Patent: *Sep. 19, 2017

(54) TOUCH SENSOR PANELS WITH REDUCED STATIC CAPACITANCE

(71) Applicant: Apple Inc., Cupertino, CA (US)

(72) Inventors: Steven Porter Hotelling, Los Gatos, CA (US); Marduke Yousefpor, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/019,913

(22) Filed: Feb. 9, 2016

(65) Prior Publication Data

US 2016/0154525 A1 Jun. 2, 2016

Related U.S. Application Data

(62) Division of application No. 13/921,155, filed on Jun. 18, 2013, now Pat. No. 9,268,445, which is a division of application No. 12/545,741, filed on Aug. 21, 2009, now Pat. No. 8,507,811.

(60) Provisional application No. 61/149,289, filed on Feb. 2, 2009.

(51) Int. Cl.
*G06F 3/041* (2006.01)
*G06F 3/044* (2006.01)
*H03K 17/96* (2006.01)
*G06F 3/047* (2006.01)

(52) U.S. Cl.
CPC ............ *G06F 3/0416* (2013.01); *G06F 3/044* (2013.01); *G06F 3/047* (2013.01); *G06F 3/0412* (2013.01); *H03K 17/9622* (2013.01); *G06F 2203/04112* (2013.01)

(58) Field of Classification Search
CPC ...... G06F 3/0416; G06F 3/0412; G06F 3/044; H03K 17/9622
USPC ........................................................ 345/174
See application file for complete search history.

(56) References Cited

U.S. PATENT DOCUMENTS

| 5,483,261 A | 1/1996 | Yasutake |
| 5,488,204 A | 1/1996 | Mead et al. |
| 5,825,352 A | 10/1998 | Bisset et al. |
| 5,835,079 A | 11/1998 | Shieh |

(Continued)

FOREIGN PATENT DOCUMENTS

| CN | 101311890 A | 11/2008 |
| JP | 2000-163031 A | 6/2000 |
| JP | 2002-342033 A | 11/2002 |

OTHER PUBLICATIONS

Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.

(Continued)

*Primary Examiner* — Fred Tzeng
(74) *Attorney, Agent, or Firm* — Morrison & Foerster LLP

(57) ABSTRACT

Capacitive touch panels may include a plurality of positive voltage lines that are driven at a first phase. These positive voltage lines may be used to provide the drive capacitance signal sensed by one or more sense regions. The touch panels may also include a plurality of negative phase voltage lines that are driven at a phase that is different than the first phase. Both the positive and negative voltage lines may cross-under one or more sense regions. The negative phase voltage lines are able to counter act and reduce the static capacitance in the sense regions.

17 Claims, 16 Drawing Sheets

(56) References Cited

U.S. PATENT DOCUMENTS

| | | |
|---|---|---|
| 5,880,411 A | 3/1999 | Gillespie et al. |
| 6,188,391 B1 | 2/2001 | Seely et al. |
| 6,310,610 B1 | 10/2001 | Beaton et al. |
| 6,323,846 B1 | 11/2001 | Westerman et al. |
| 6,690,387 B2 | 2/2004 | Zimmerman et al. |
| 7,015,894 B2 | 3/2006 | Morohoshi |
| 7,184,064 B2 | 2/2007 | Zimmerman et al. |
| 7,663,607 B2 | 2/2010 | Hotelling et al. |
| 7,928,941 B2 | 4/2011 | Yamazaki et al. |
| 8,139,052 B2 | 3/2012 | Ito |
| 8,479,122 B2 | 7/2013 | Hotelling et al. |
| 8,507,811 B2 | 8/2013 | Hotelling et al. |
| 8,654,088 B2 | 2/2014 | Yamauchi et al. |
| 9,268,445 B2 | 2/2016 | Hotelling et al. |
| 2006/0026521 A1 | 2/2006 | Hotelling et al. |
| 2006/0097991 A1 | 5/2006 | Hotelling et al. |
| 2006/0197753 A1 | 9/2006 | Hotelling |
| 2008/0136964 A1 | 6/2008 | Yamazaki |
| 2008/0158175 A1 | 7/2008 | Hotelling et al. |
| 2008/0158183 A1 | 7/2008 | Hotelling et al. |
| 2008/0246739 A1 | 10/2008 | Choi et al. |
| 2008/0278459 A1 | 11/2008 | Yamashita |
| 2009/0009483 A1 | 1/2009 | Hotelling et al. |
| 2009/0219237 A1 | 9/2009 | Yamazaki |
| 2010/0149108 A1 | 6/2010 | Hotelling et al. |
| 2010/0193257 A1 | 8/2010 | Hotelling et al. |
| 2010/0231562 A1 | 9/2010 | Brown |
| 2013/0278557 A1 | 10/2013 | Hotelling et al. |

OTHER PUBLICATIONS

Non-Final Office Action mailed Nov. 8, 2012, for U.S. Appl. No. 12/545,741, filed Aug. 21, 2009, six pages.
Non-Final Office Action mailed Apr. 17, 2013, for U.S. Appl. No. 12/545,741, filed Aug. 21, 2009, 7 pages.
Non-Final Office Action mailed Mar. 12, 2015, for U.S. Appl. No. 13/921,155, filed Jun. 18, 2013, nine pages.
Notice of Allowance mailed May 23, 2013, for U.S. Appl. No. 12/545,741, filed Aug. 21, 2009, 6 pages.
Notice of Allowance mailed Sep. 25, 2015, for U.S. Appl. No. 13/921,155, filed Jun. 18, 2013, five pages.
Rubine, D.H. (Dec. 1991). "The Automatic Recognition of Gestures," CMU-CS-91-202, Submitted in Partial Fulfillment of the Requirements for the Degree of Doctor of Philosophy in Computer Science at Carnegie Mellon University, 285 pages.
Rubine, D.H. (May 1992). "Combining Gestures and Direct Manipulation," CHI '92, pp. 659-660.
Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

TOUCH SENSOR PANELS WITH REDUCED STATIC CAPACITANCE

CROSS REFERENCES TO RELATED APPLICATIONS

This application is a divisional of U.S. patent application Ser. No. 13/921,155, filed Jun. 18, 2013 and published on Oct. 24, 2013 as U.S. Publication No. 2013-0278557; which is a divisional of U.S. patent application Ser. No. 12/545,741, filed Aug. 21, 2009 and issued on Aug. 13, 2013 as U.S. Pat. No. 8,507,811; which claims priority to Provisional U.S. Patent Application No. 61/149,289, filed Feb. 2, 2009; the contents of which are hereby incorporated by reference in their entirety for all purposes.

FIELD OF THE INVENTION

This relates to touch sensor panels with reduced static capacitance, and more particularly to touch sensors that include negative phase voltage lines that reduce the static capacitance of the sensor panels.

BACKGROUND OF THE INVENTION

Many types of input devices are available for performing operations in a computing system, such as buttons or keys, mice, trackballs, joysticks, touch sensor panels, touch screens, and the like. Touch screens, in particular, are becoming increasingly popular because of their ease and versatility of operation as well as their declining price. Touch screens can include a touch sensor panel, which can be a clear panel with a touch-sensitive surface, and a display device such as a liquid crystal display (LCD) that can be positioned partially or fully behind the panel so that the touch-sensitive surface can cover at least a portion of the viewable area of the display device. Touch screens generally allow a user to perform various functions by touching (e.g. physical contact or near-field proximity) the touch sensor panel using a finger, stylus or other object at a location dictated by a user interface (UI) being displayed by the display device. In general, touch screens can recognize a touch event and the position of the touch event on the touch sensor panel, and the computing system can then interpret the touch event in accordance with the display appearing at the time of the touch event, and thereafter can perform one or more actions based on the touch event.

Mutual capacitance touch sensor panels can be formed from a matrix of drive and sense lines of a substantially transparent conductive material, such as Indium Tin Oxide (no). The lines are often arranged orthogonally on a substantially transparent substrate. It is due in part to their substantial transparency that capacitive touch sensor panels can be overlaid on a display to form a touch screen, as described above. However, overlaying a display with a touch sensor panel can have drawbacks, such as added weight and thickness, and decreased brightness of the display.

SUMMARY OF THE INVENTION

This generally relates to touch sensor panels with reduced static capacitance, and more particularly to touch sensors that may include positive voltage drive lines that are used to drive the drive regions of the sensor panels and negative phase voltage lines that reduce the static capacitance of the sensor panels. By reducing the static capacitance the accuracy of the panels may be improved and the amount of power used to achieve an accurate touch may be reduced.

The touch panels may include a plurality of positive voltage lines that are driven at a first phase. These positive voltage lines may be used to provide the drive capacitance signal sensed by one or more sense regions. The touch panels may also include a plurality of negative phase voltage lines that are driven at a second phase that may be different than the first phase. Both the positive and negative voltage lines may cross-under one or more sense regions. The negative phase voltage lines are able to counter act and reduce the static capacitance in the sense region. The amount of static capacitance may be tuned by selecting the number of negative voltage lines that cross-under the sense regions.

One embodiment of a sensor panel that may include a matrix of voltage lines that may be driven in both a positive and negative phase manner may be a sensor panels with integrated LCD functionality. Such a sensor panel may include a matrix of voltage data lines for addressing the LCD and sense pixels individually.

DETAILED DESCRIPTION OF THE
PREFERRED EMBODIMENTS

In the following description of preferred embodiments, reference is made to the accompanying drawings which form a part hereof, and in which it is shown by way of illustration specific embodiments in which the invention can be practiced. It is to be understood that other embodiments can be used and structural changes can be made without departing from the scope of the embodiments of this invention.

The description includes examples of touch panels with dual-function capacitive elements that can form (a) part of a display system that generates an image on the display, and (b) part of a touch sensing system that senses touch events on or near the display. The capacitive elements can be, for example, capacitors in pixels of an LCD that are configured to operate individually, each as a pixel storage capacitor, or electrode, of a pixel in the display system, and may be configured to operate collectively as elements of the touch sensing system. In this way, for example, a display with integrated touch sensing capability may be manufactured using fewer parts, layers and/or processing steps, and the display itself may be thinner and brighter.

Sensor panels with integrated LCD functionality may include a matrix of voltage data lines for addressing the LCD and sense pixels individually. Although touch panels that include the examples include these dual functioning elements, the concepts described herein also include sensor panel embodiments including voltage lines that do not include display functionalities. During a sense operation, some of the voltage lines may be driven in a positive phase to drive the drive regions of the sensor panel. In addition, one or more of the voltage lines may be driven in a negative phase with respect to the positive voltage lines used to drive the drive regions of the sensor panel. These negative phase voltage lines may be used to reduce the static capacitance of the sensor panels.

Figure 1:
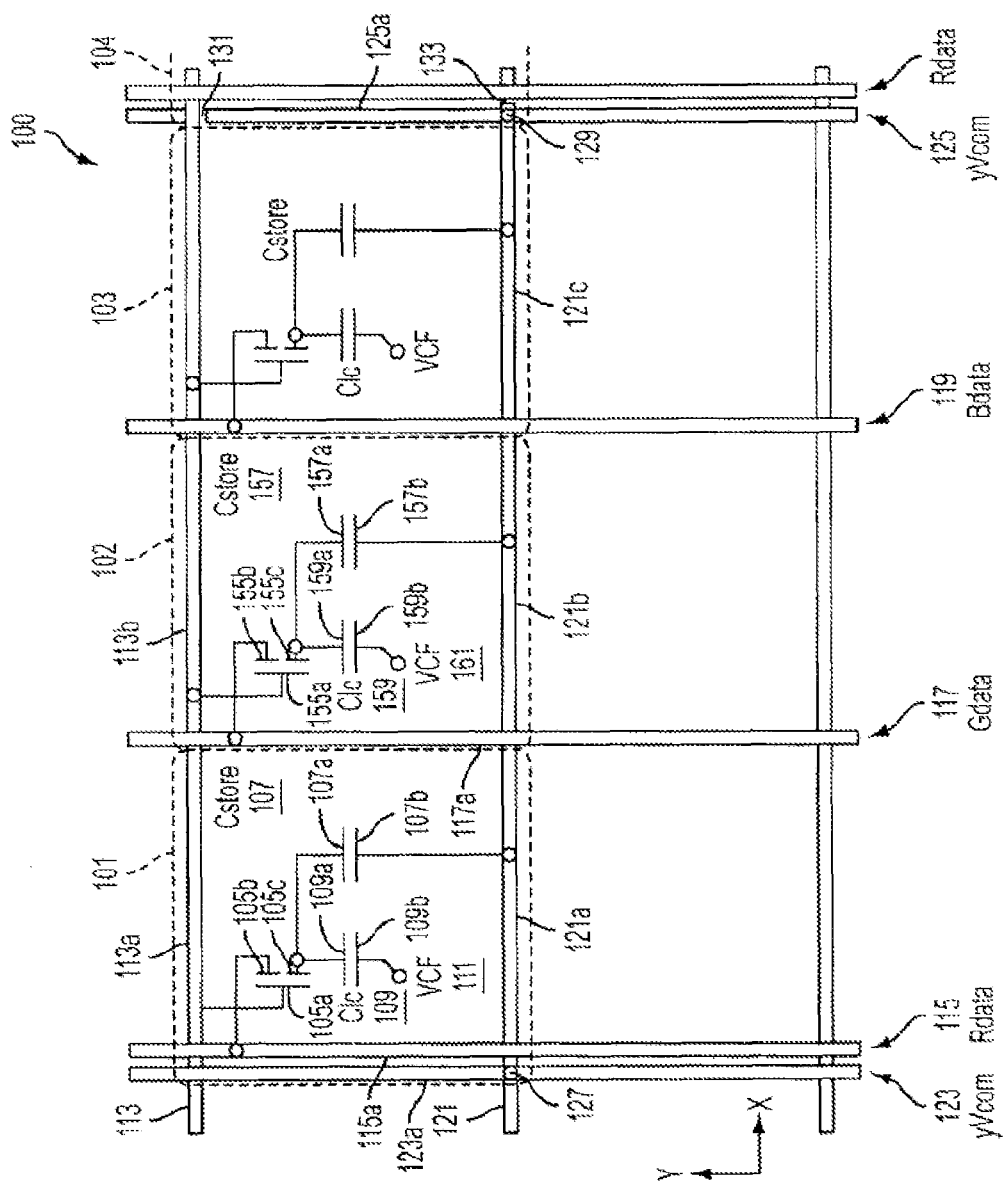
FIG. 1 illustrates a partial circuit diagram of an example LCD including a plurality of LCD pixels according to embodiments of the present invention.

FIG. 1 is a partial circuit diagram of example LCD panel 100 including a plurality of LCD sub-pixels according to embodiments of the present invention. The sub-pixels of panel 100 are configured such that they are capable of dual-functionality as both LCD sub-pixels and touch sensor elements. That is, the sub-pixels include capacitive elements or electrodes that can operate as part of the LCD circuitry of the pixels and that can also operate as elements of touch sensing circuitry. In this way, panel 100 can operate as an LCD with integrated touch sensing capability. FIG. 1 shows details of sub-pixels 101, 102, 103, and 104 of display 100. Note that each of the sub-pixels can represent either red (R), green (G) or blue (B), with the combination of all three R, G and B sub-pixels forming a single color pixel.

Sub-pixel 102 can include thin film transistor (TFT) 155 with gate 155a, source 155b, and drain 155c. Sub-pixel 102 can also include storage capacitor, Cst 157, with upper electrode 157a and lower electrode 157b, liquid crystal capacitor, Clc 159, with sub-pixel electrode 159a and common electrode 159b, and color filter voltage source, Vcf 161. If a sub-pixel may be an in-plane-switching (IPS) device, Vcf can be, for example, a fringe field electrode connected to a common voltage line in parallel with Cst 157. If a sub-pixel does not utilize IPS, Vcf 161 can be, for example, an ITO layer on the color filter glass. Sub-pixel 102 can also include portion 117a of a data line for green (G) color data, Gdata line 117, and portion 113b of gate line 113. Gate 155a may be connected to gate line portion 113b, and source 155b may be connected to Gdata line portion 117a. Upper electrode 157a of Cst 157 may be connected to drain 155c of TFT 155, and lower electrode 157b of Cst 157 may be connected to portion 121b of a common voltage line that runs in the x-direction, xVcom 121. Sub-pixel electrode 159a of Clc 159 may be connected to drain 155c of TFT 155, and common electrode 159b of Clc 159 may be connected to Vcf 161.

The circuit diagram of sub-pixel 103 can be identical to that of sub-pixel 102. However, as shown in FIG. 1, color data line 119 running through sub-pixel 103 carries blue (B) color data. Sub-pixels 102 and 103 can be, for example, known LCD sub-pixels.

Similar to sub-pixels 102 and 103, sub-pixel 101 may include thin film transistor (TFT) 105 with gate 105a, source 105b, and drain 105c. Sub-pixel 101 may also includes storage capacitor Cst 107, with an upper electrode 107a and lower electrode 107b, liquid crystal capacitor Clc 109, with sub-pixel electrode 109a and common electrode 109b, and color filter voltage source, Vcf 111. Sub-pixel 101 may also include portion 115a of a data line for red (R) color data, Rdata line 115, and portion 113a of gate line 113. Gate 105a may be connected to gate line portion 113a, and source 105b may be connected to Rdata line portion 115a. Upper electrode 107a of Cst 107 may be connected to drain 105c of TFT 105, and lower electrode 107b of Cst 107 may be connected to portion 121a of xVcom 121. Sub-pixel electrode 109a of Clc 109 may be connected to drain 105c of TFT 105, and common electrode 109b of Clc 109 may be connected to Vcf 111.

Unlike sub-pixels 102 and 103, sub-pixel 101 may also includes portion 123a of a common voltage line running in the y-direction, yVcom 123. In addition, sub-pixel 101 may include connection 127 that connects portion 121a to portion 123a. Thus, connection 127 may connect xVcom 121 and yVcom 123.

Sub-pixel 104 (only partially shown in FIG. 1) may be similar to sub-pixel 101, except that portion 125a of yVcom 125 may have break (open) 131, and portion 121b of xVcom 121 may have break 133.

As can be seen in FIG. 1, the lower electrodes of storage capacitors of sub-pixels 101, 102, and 103 may be connected together by xVcom 121. This connection may be used in conjunction with gate lines, data lines, and transistors, to allow sub-pixels to be addressed. The addition of vertical common voltage lines along with connections to the horizontal common voltage lines allows grouping of sub-pixels in both the x-direction and y-direction, as described in further detail below. For example, yVcom 123 and connection 127 to xVcom 121 can allow the storage capacitors of sub-pixels 101, 102, and 103 to be connected to storage capacitors of sub-pixels that may be above and below sub-pixels 101, 102, 103 (the sub-pixels above and below are not shown). For example, the sub-pixels immediately above sub-pixels 101, 102, and 103 can have the same configurations as sub-pixels 101, 102, and 103, respectively. In this case, the storage capacitors of the sub-pixels immediately above sub-pixels 101, 102, and 103 would be connected to the storage capacitors of sub-pixels 101, 102, and 103.

In general, an LCD panel could be configured such that the storage capacitors of all sub-pixels in the panel may be connected together, for example, through at least one vertical common voltage line with connections to a plurality of horizontal common voltage lines. Another LCD panel could be configured such that different groups of sub-pixels may be connected together to form a plurality of separate regions of connected-together storage capacitors.

One way to create separate regions may be by forming breaks (opens) in the horizontal and/or vertical common lines. For example, yVcom 125 of panel 100 may have break 131, which can allow sub-pixels above the break to be isolated from sub-pixels below the break. Likewise, xVcom 121 may have break 133, which can allow sub-pixels to the right of the break to be isolated from sub-pixels to the left of the break.

Figure 2:
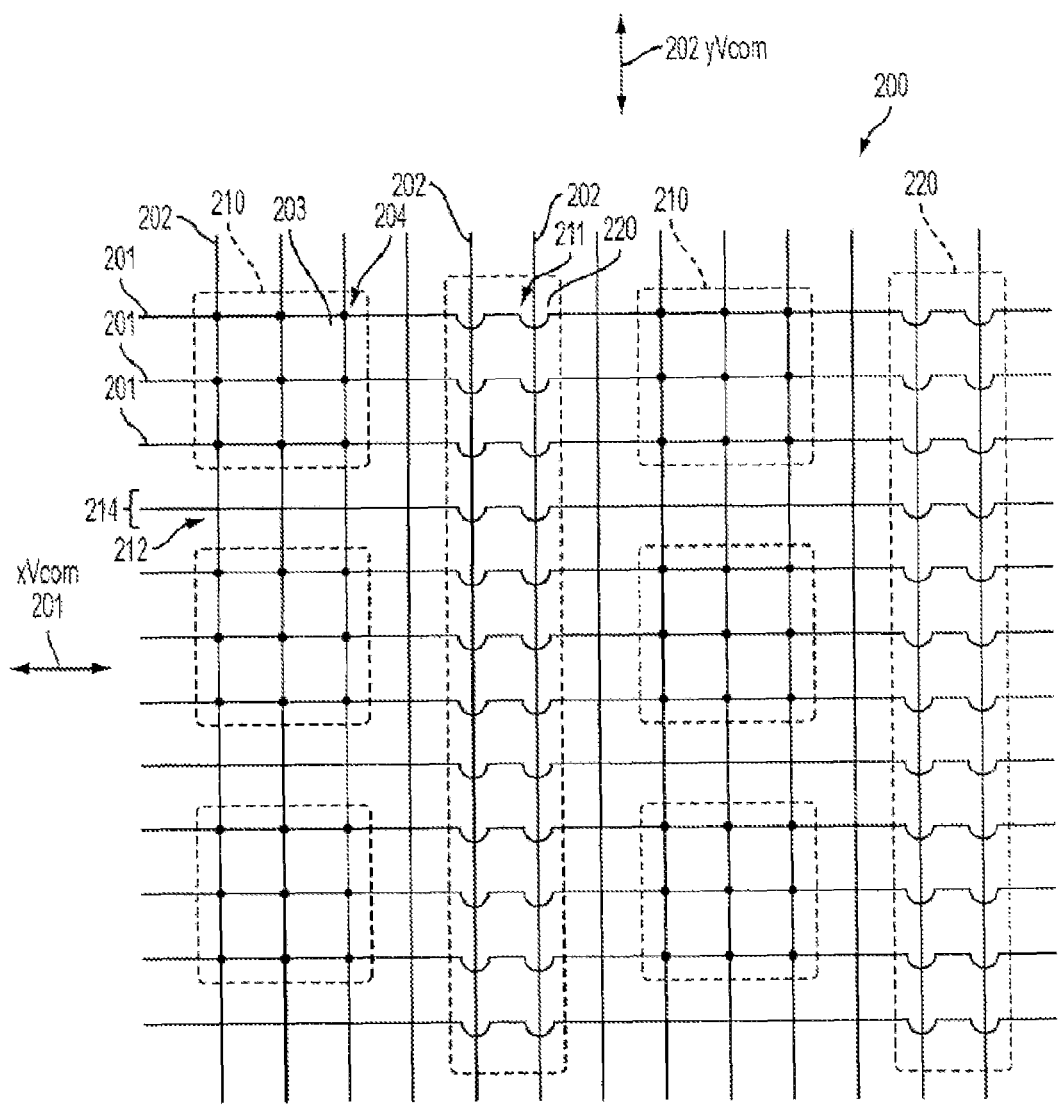
FIG. 2 illustrates an exemplary LCD having display and touch modes in which touch regions can be formed by groups of pixels in the LCD according to embodiments of the invention.

FIG. 2 illustrates an exemplary LCD and touch panel having display and touch modes in which touch regions can be formed by groups of pixels in the LCD according to embodiments of the invention. In the example of FIG. 2, LCD 200 can have a plurality of touch regions, which can include a plurality of drive regions 210 and a plurality of sense regions 220. The drive regions 210 and the sense regions 220 can include groups of pixels 203, which can display data in the display mode and sense touch in the touch mode. For simplicity, each pixel 203 is shown as a single block with a vertical common voltage line yVcom 202 and a horizontal common voltage line xVcom 201, where each single pixel block can represent a group of red, green, and blue sub-pixels each having a data line, as shown in FIG. 1.

The drive region may be responsible for creating the field sensed by the sense region for touch sensing. Drive region 210 can be formed by connecting at least one vertical common voltage line yVcom 202 of pixel 203 with at least one horizontal common voltage line xVcom 201 of the pixel at connection 204, thereby forming a drive region consisting of a row of pixels. For example, drive region 210 is formed by connecting the xVcom line 201 for each of three rows to the yVcom line 202. A conductive transparent drive plate (e.g. indium tin oxide (ITO) plate) can be used to cover the drive region and connect to the vertical and horizontal common voltage lines. Generally, a drive region may be larger than a single pixel, and may be comparable to the size of a finger tip, for example, in order to effectively receive a touch or near touch on the LCD.

For example, a drive region can be formed by connecting a plurality of vertical common voltage lines yVcom with a plurality of horizontal common voltage lines xVcom, thereby forming a drive region consisting of a matrix of pixels. In some embodiments, drive regions proximate to each other can share horizontal common voltage lines xVcom, which can be used to stimulate the drive regions with stimulation signals, which will be described in more detail later. In some embodiments, drive regions proximate to each other can share vertical common voltage lines yVcom with breaks 212 in the lines between the drive regions in order to minimize the lines causing parasitic capacitance that could interfere with the received touch or near touch. The ground regions 214 formed of xVcom lines 201 and yVcom lines 202 between the drive regions may be connected to ground or a virtual ground in order to further minimize the interference between drive regions 210 and between the drive regions and the sense regions 220. Optionally and alternatively, the vertical common voltage line breaks can be omitted and the lines shared in their entirety among the drive regions.

A sense region 220 can be formed by at least one vertical common voltage line yVcom 202 of a pixel, thereby forming a sense region consisting of a column of pixels. A conductive transparent sense plate (e.g., ITO plate) can be used to cover the sense region and connect to the vertical common voltage line. Generally, a sense region may be larger than a single column of pixels in order to effectively sense a received touch or near touch on the touch sensitive device. For example, a sense region can be formed by a plurality of vertical common voltage lines yVcom, thereby forming a sense region consisting of a matrix of pixels. In the sense region, the vertical common voltage lines yVcom can be unconnected from and can cross over (at 211) the horizontal common voltage lines xVcom to form the mutual capacitance structure for touch sensing. This cross over yVcom and xVcom also forms an additional parasitic capacitance between the sense and drive ITO regions.

In operation during touch mode, the horizontal common voltage lines xVcom 201 can transmit stimulation signals to stimulate the drive regions 210 to form electric field lines between the stimulated drive regions and adjacent sense regions 220. When an object such as a finger touches or near touches a stimulated drive region 210, the object can block some of the electric field lines extending to the adjacent sense regions 220, thereby reducing the amount of charge coupled to these adjacent sense regions. This reduction in charge can be sensed by the sense regions 220 as an "image" of touch. This touch image can be transmitted along the vertical common voltage lines yVcom 202 to touch circuitry for further processing.

The drive regions of FIG. 2 are shown as rows of connected drive ITO rectangles regions and the sense regions of FIG. 2 are shown as rectangles extending the vertical length of the LCD. However, the drive and sense regions are not limited to the shapes, orientations, and positions shown, but can include any suitable configurations according to embodiments of the invention. It is to be understood that the pixels used to form the touch regions are not limited to those described above, but can be any suitable pixels having touch capabilities according to embodiments of the invention.

A touch sensing operation according to embodiments of the invention will be described with reference to FIGS. 3-5B. For the sake of clarity, the operation is described in terms of a single drive pixel and a single sense pixel. However, it is understood that the drive pixel may be connected to other drive pixels in a drive region and the sense pixel may be connected to other sense pixels in the sense region, as described above. Thus, in actual operation, the entire drive region may be driven, and the entire sense region can contribute to the sensing of touch.

Figure 3:
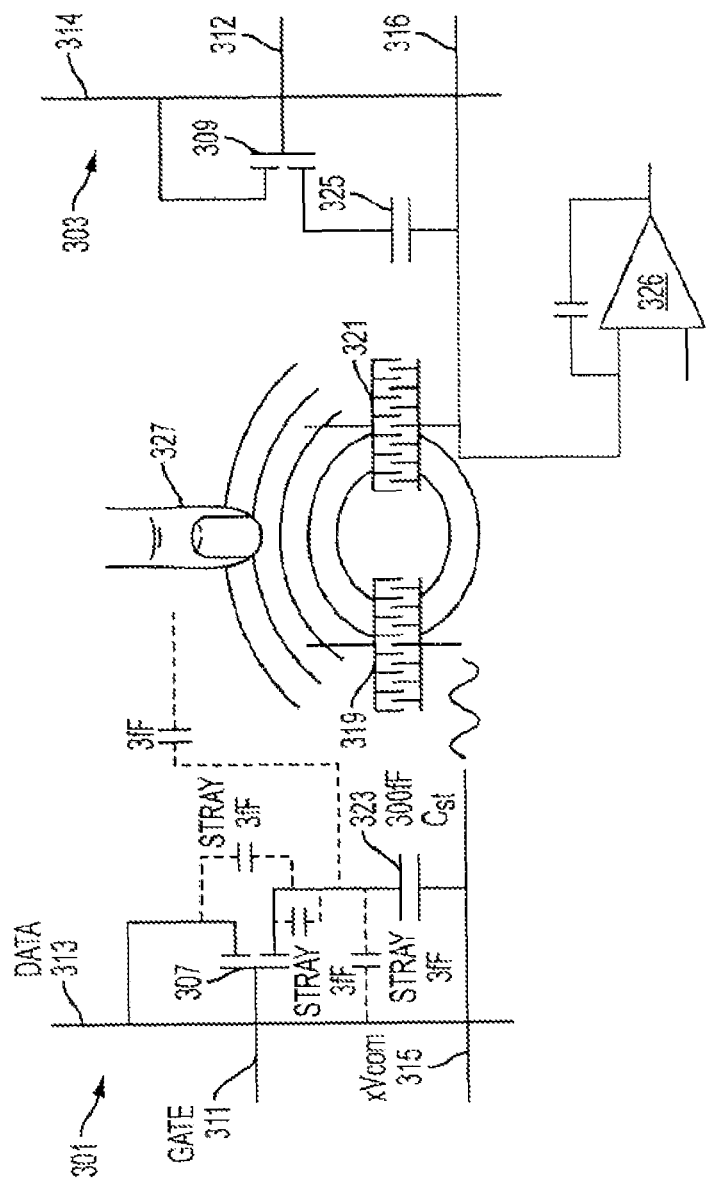
FIG. 3 illustrates partial circuit diagrams of a pixel of a drive region and a pixel of a sense region according to embodiments of the invention.

FIG. 3 shows partial circuit diagrams of pixel 301 of an example drive region and pixel 303 of an example sense region. Pixels 301 and 303 include TFTs 307 and 309, gate lines 311 and 312, data lines 313 and 314, xVcom lines 315 and yVcom lines 316, fringe field electrodes 319 and 321, and storage capacitors 323 and 325. In the example of FIG. 3, storage capacitors 323 and 325 each have a capacitance of about 300 fF (femto-Farads). A lower electrode of fringe field electrode 321 of pixel 303 can be connected, through yVcom 316, to charge amplifier 326 in the sense circuitry. Charge amplifier 326 holds this line at a virtual ground such that any charge that gets injected from fringe field electrode 321 shows up as a voltage output of the amplifier. While the feedback element of the amplifier is shown as a capacitor, it may also function as a resistor or a combination of a resistor and capacitor. The feedback can also be, for example, a resistor and capacitor feedback for minimizing die-size of the touch sensing circuitry. Exemplary FIG. 3 also shows finger 327 that creates a stray capacitance of approximately 3 fF with a cover glass (not shown), and shows other stray capacitances in the pixels, each of which is approximately 3 fF.

Figure 4A:
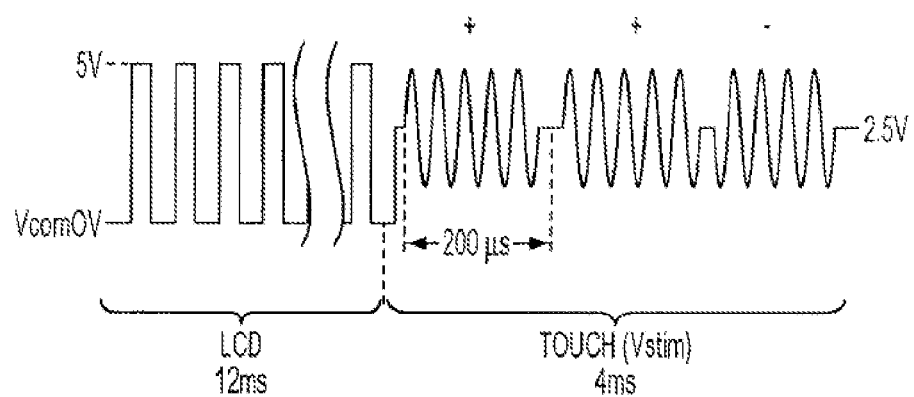
FIG. 4A illustrates example signals applied to the pixels of a drive region during an LCD phase and during a touch phase according to embodiments of the invention.

FIG. 4A shows example signals applied through xVcom 315 to the pixels of the drive region, including pixel 301, during an example LCD phase and during an example touch phase. During the LCD phase, xVcom 315 and yVcom 316 may, for example, be driven with a square wave signal of 2.5V+/−2.5V, in order to perform LCD inversion. The LCD phase may, for example, be 12 ms in duration. In the touch phase, xVcom 315 may, for example, be driven with 15 to 20 consecutive stimulation phases lasting 200 microseconds each while yVcom 316 may be maintained at a virtual ground of sense preamp of touch ASIC. The stimulation signals in this case may be square or sinusoidal signals of 2.5V+/−2V each having the same frequency and a relative phase of either 0 degrees or 180 degrees (corresponding to "+" and "−" in FIG. 4A). The touch phase may, for example, be 4 ms in duration.

Figure 5A:
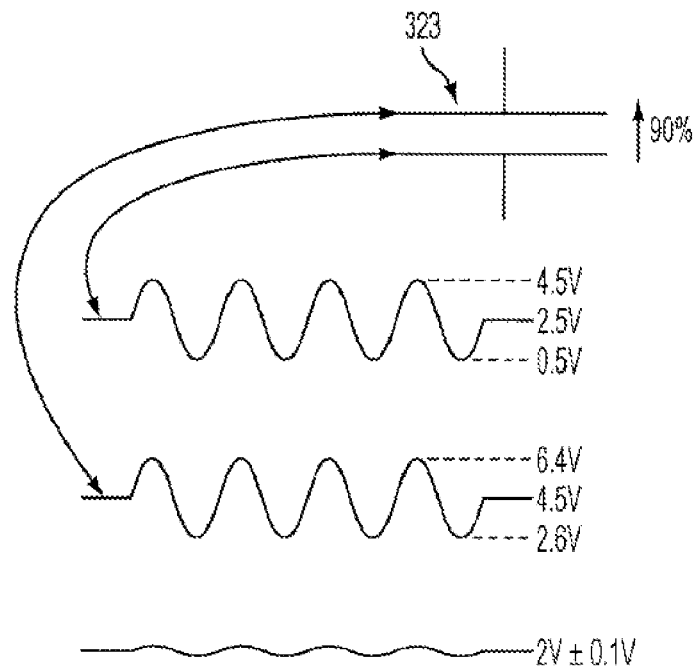
FIG. 5A illustrates details of an example operation of a storage capacitor of a drive region during a touch phase according to embodiments of the invention.

FIG. 5A shows details of the operation of storage capacitor 323 during the touch phase. In particular, because the capacitance of storage capacitor 323 may be much higher than the other capacitances (i.e., stray capacitances shown in FIG. 3), almost all (approximately 90%) of the AC component of the 2.5V+/−2V sinusoidal stimulation signal that may be applied at the lower electrode of the storage capacitor may be transferred to the upper electrode. In this manner the, Liquid Crystal of LCD will experience minimal electric field changes due to the touch stimuli and maintain its charge state as it was set by during the LCD mode. Therefore, the upper electrode, along with bottom Vcom electrode of 319 may be charged to 4.5 volts DC for the touch mode operation of the LCD, sees a sinusoidal signal of 4.5V+/−1.9V. These signals may be passed to the corresponding top and bottom in comb structures of electrodes 321 which may be kept at the virtual ground of the sense preamp of touch ASIC. Thus, fringe field and Vcom electrodes of 319 and 321 together with the interference of the user finger 327 can form a mutual capacitance touch sensing structure.

At the same time, fringe field electrode 319 may be configured to operate as a drive element for the touch sensing system, the fringe field electrode may continue to operate as a part of the LCD system. As shown in FIG. 5A, while the voltages of the comb structures of fringe field electrode may be each modulated at approximately +/−2V, the relative voltage between the comb structures remains approximately constant at 2V+/−0.1V. This relative voltage may be the voltage that is seen by the liquid crystal of the pixel for the LCD operation. The 0.1V AC variance in the relative voltage during the touch phase should have an acceptably low affect on the LCD, particularly since the AC variance would typically have a frequency that may be higher than the response time for the liquid crystal. For example, the stimulation signal frequency, and hence the frequency of the AC variance, would typically be more than 100 kHz. However, the response time for liquid crystal is typically less than 100 Hz. Therefore, the fringe field electrode's function as a drive element in the touch system should not interfere with the fringe field electrode's LCD function.

Figure 4B:
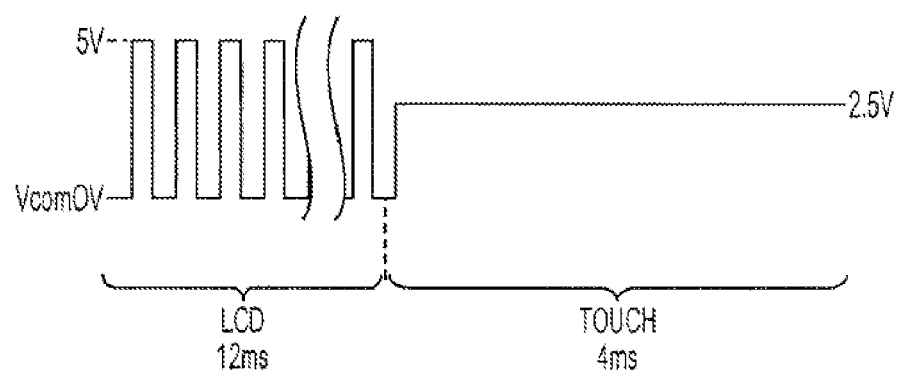
FIG. 4B illustrates example signals applied to the pixels of a sense region during an LCD phase and during a touch phase according to embodiments of the invention.
Figure 5B:
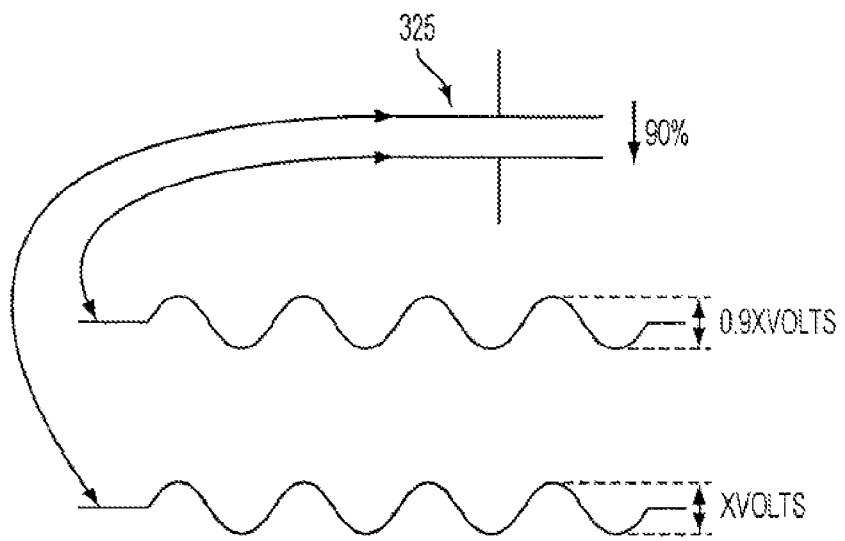
FIG. 5B illustrates details of an example operation of a storage capacitor of a sense region during a touch phase according to embodiments of the invention.

Referring now to FIGS. 3, 4B, and 5B, an example operation of the sense region will now be described. FIG. 4B shows signals applied through yVcom 316 to the pixels of the sense region, including pixel 303, during the LCD and touch phases described above. As with the drive region, yVcom 316 may be driven with a square wave signal of 2.5V+/−2.5V in order to perform LCD inversion during the LCD phase. During the touch phase, yVcom 316 may be connected to amplifier 326, which holds the voltage at or near a virtual ground of 2.5V. Consequently, fringe field electrode 321 may also be held at 2.5V. As shown in FIG. 3, fringing electrical fields propagate from fringe field electrode 319 to fringe field electrode 321. As described above, the fringing electric fields may be modulated at approximately +/−2V by the drive region. When these fields are received by the top electrode of fringing field electrode 321, most of the signal gets transferred to the lower electrode, because pixel 303 may have the same or similar stray capacitances and storage capacitance as pixel 301.

Because yVcom 316 may be connected to charge amplifier 326, and may be held at virtual ground, any charge that gets injected will show up as an output voltage of the charge amplifier. This output voltage provides the touch sense information for the touch sensing system. For example, when finger 327 gets close to the fringing fields, it captures some fields and grounds them, which causes a disturbance in the fields. This disturbance can be detected by the touch system as a disturbance in the output voltage of charge amplifier 326. FIG. 5B shows that approximately 90% of a received fringing field at pixel 302 that impinges onto the electrode half of the capacitor which may also be connected to the drain of the TFT 325 will be transferred to charge amplifier 326. 100% of the charge that impinges onto the electrode half of the capacitor, which is connected directly to yVcom 316, will be transferred to charge amplifier 326. The ratio of charge impinging onto each electrode will depend on the LCD design. For non-IPS, nearly 100% of the finger affected charge will impinge on the Vcom electrode because the patterned CF plate is nearest the finger. For an IPS-type display the ratio will be closer to half and half because each part of the electrode may have approximately equal area (or ¼ vs. ¾) facing the finger. For some sub-types of IPS displays, the fringing electrodes may not be coplanar, and the majority of the upward facing area may be devoted to the Vcom electrode.

The example driving and sensing operations of FIGS. 3, 4A-B, and 5A-B are described using single pixels for the sake of clarity.

Figure 6:
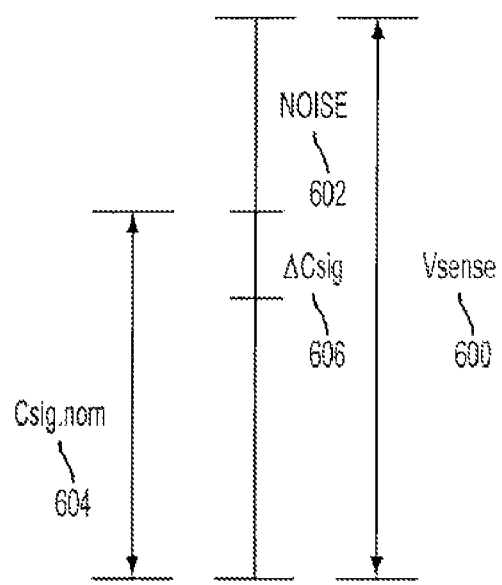
FIG. 6 illustrates the components of a capacitance signal Csig measured at a sense region according to embodiments of the invention.

FIG. 6 shows the components of the capacitance signal Vsense 600 measured at a sense region. As discussed above, the fringe field lines that extend from the drive regions to the sense regions create a capacitance signal that may be sensed at a sense region. Vsense 600 represents the total capacitance signal measured at a sense region. Vsense 600 includes noise 602, which represents capacitance due to coupling between the sense region and various background components. Csig.nom 604 is the starting coupling between the drive and sense region. When a finger or other object blocks a portion of the fringing electrical fields that extend from the drive and sense regions, Csig.nom 604 and Vsense 600 may be reduced by ΔCsig 606. Accordingly, the signal capacitance at the sense region becomes Csig.nom-ΔCsig, where Csig.nom represents the static (no touch) component and ΔCsig represents the dynamic (touch) component.

Noise 600 may always be nonzero due to the inability of a finger, palm or other object to block all electric fields that may be produced on a touch panel, especially those electric fields that remain entirely within the touch panel. In addition, it should be understood that as a finger is pushed harder or more completely onto the multi-touch panel, the finger can tend to flatten, blocking more and more of the electric fields, and thus ΔCsig can be variable and representative of how completely the finger is pushing down on the panel (i.e. a range from "no-touch" to "full-touch").

The resolution of ΔCsig as measured at the sense region may be related to the proportional dynamic range ΔCsig/Vsense. The proportionate dynamic range can be increased by increasing the Csig.nom relative to the noise component. This can be accomplished by increasing the power supplied to the drive lines. This, however, also increases the power consumption of the device. Another method of increasing the proportionate dynamic range ΔCsig/Csig may include removing components of Vsense that do not contribute to ΔCsig.

Figure 7:
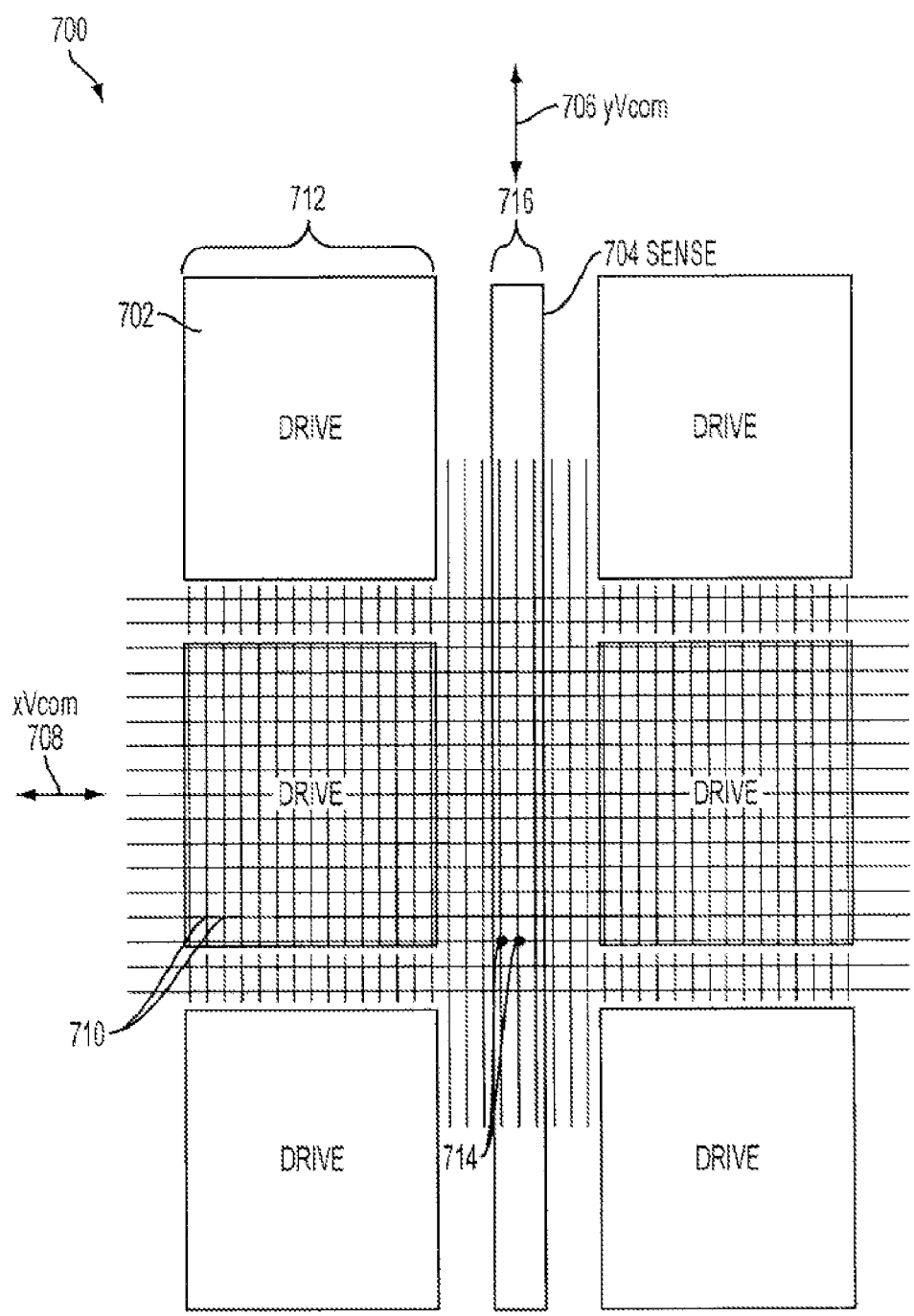
FIG. 7 illustrates an exemplary touch and display array including drive regions and sense regions according to embodiments of the invention.

FIG. 7 illustrates an embodiment of touch and display array 700 including drive regions 702 and sense regions 704. The drive regions 702 may be formed from one or more drive pixels 710. The drive pixels include a connection to at least one vertical common voltage line yVcom 706 and at least one horizontal common voltage line xVcom 708. Drive ITO plate 712 can be used to cover drive region 702 and provide for connection of the vertical and horizontal common voltage lines 706 and 708 in drive region 702.

A sense region 704 can be formed by at least one vertical common voltage line yVcom 706 of sense pixel 714, thereby forming sense region 704 including column of pixels 714. Sense ITO plate 716 can be used to cover the sense region and provide connection to vertical common voltage line 706.

In operation during touch mode, the horizontal common voltage lines xVcom 708 can transmit stimulation signals to stimulate the drive regions 702 to form electric field lines between the stimulated drive regions and adjacent sense regions 704. These electric field lines contribute to Csig.nom. When an electrically conductive object, such as a finger, touches or near touches a stimulated drive region 702, the object can block some of the electric field lines extending to the adjacent sense regions 704, thereby reducing the amount of charge coupled to these adjacent drive/sense regions. This reduction in charge is ΔCsig. The xVcom lines may not be connected to the yVcom lines or to the sense ITO plate 716 in sense regions 716. However, the xVcom lines which are used to drive the drive regions nonetheless cross-under the sense region. As used herein in, the term cross-under means that the lines are in the same plain as the relevant region, but are conductively insulated from the region. The difference in potential between these cross-under xVcom lines and sense ITO drive plates 716 produces a cross-under capacitance that contributes to Csig.nom.

Figure 8:
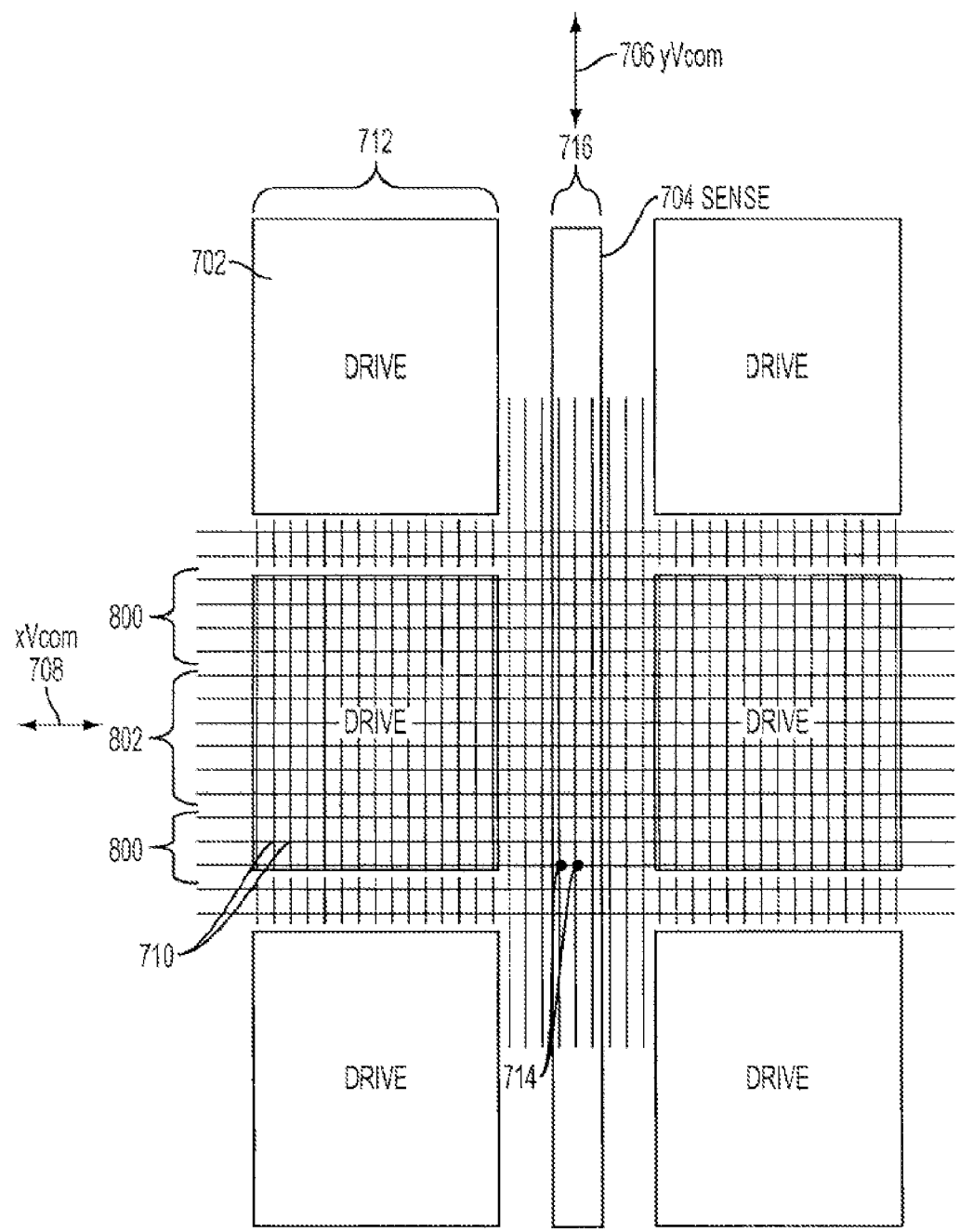
FIG. 8 illustrates an exemplary touch and display array with reduced static capacitance in which "dummy" negative xVcom lines are used in connection with main xVcom lines according to embodiments of the invention.

FIG. 8 illustrates an embodiment in which "dummy" negative xVcom lines 800 are used in connection with main xVcom lines 802. The negative xVcom may be driven with a negative phase with respect to the main drive signal. The negative phase may be completely opposite the main xVcom phase or any different phase than the main drive signal. The negative xVcom lines are connected to neither yVcom lines 706 nor to the drive ITO plate 712. Accordingly, only the main xVcom lines 802 are connected to the drive ITO plate 712 and are used to drive the drive regions 712.

Both the main xVcom lines 802 and the negative xVcom lines 800 cross-under and are conductively insulated from the yVcom lines in the sense regions 704. The cross-under capacitance of the negative phase xVcom lines 800 relative to the sense pixels in the sense region 704 counteracts the cross-under capacitance of the main xVcom positive phase lines 802.

In addition, by selecting an imbalance of more negative phase than positive phase, the inherent static Csig.nom due to the touch pixels electrodes that does not contribute to ΔCsig may be subtracted out. (This inherent static Csig.nom may, for example, be due to the fringe fields that remain within the touch panel, for example, fringe fields through a LCD polarizer, cover glass, even the out of plane above the cover glass etc.) A benefit of subtracting this Csig.nom out at the pixel location, instead of later, is that the compensated signal is in the same physical location, and subject to identical propagation delays as it travels down the sense column yVcom lines to the receive chip.

An imbalance of more negative phase cross-under capacitance may be created by using more cross-under negative xVcom lines than main positive xVcom lines. In addition, or alternatively, the voltage on the negative xVcom lines may be increased relative to the voltage of the positive xVcom lines. In FIG. 8, an imbalance of more negative xVcom lines 800 relative to the positive xVcom lines 802 is shown. The negative xVcom lines 800 have the same voltage, but opposite phase as the positive xVcom lines 802.

Figure 9A:
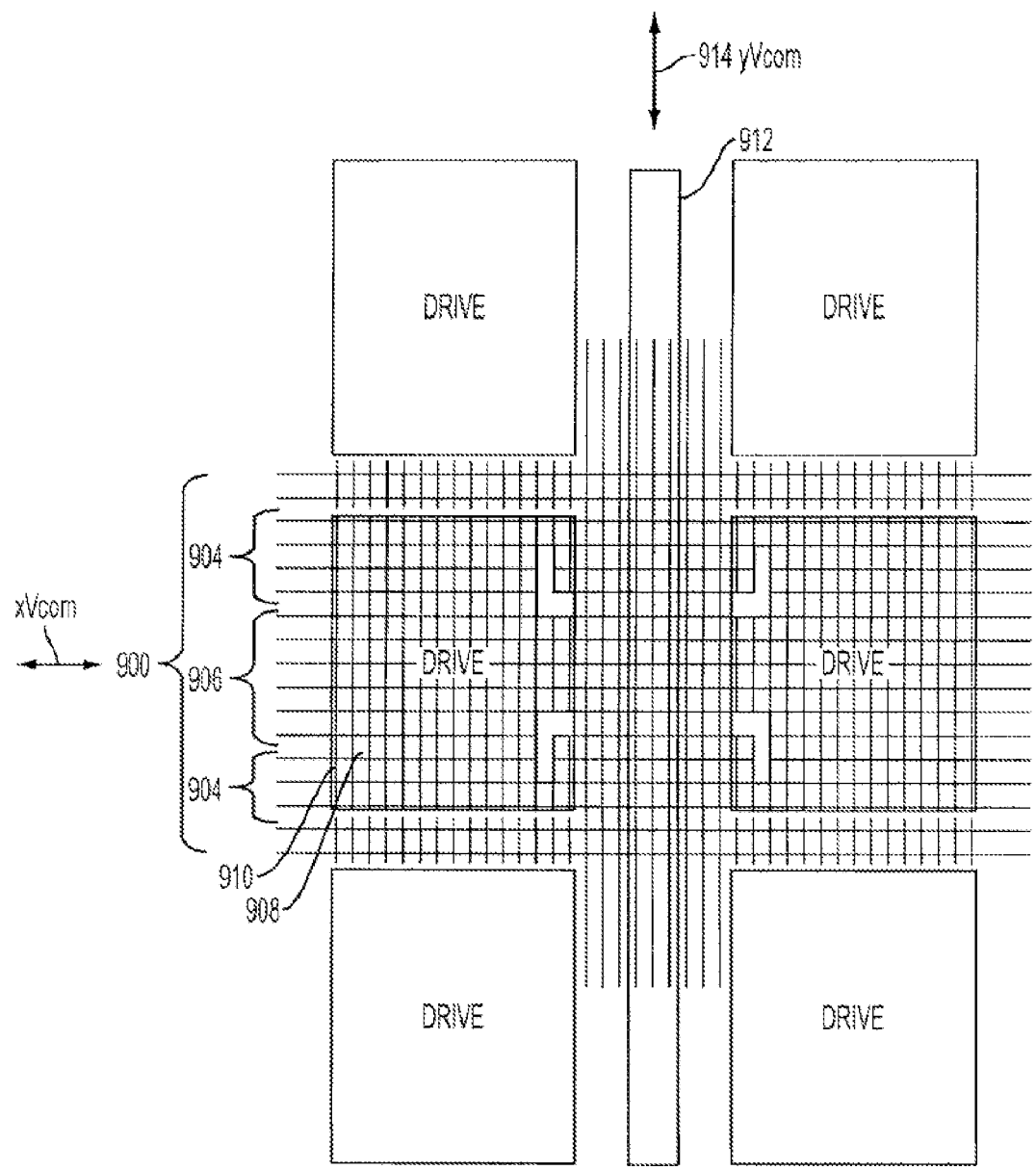
FIG. 9A illustrates an exemplary touch and display array with reduced static capacitance in which the number of "dummy" negative xVcom lines in the drive region are reduced according to embodiments of the invention.

Since the negative xVcom lines are not connected to the drive ITO plate and are not used to drive the drive regions, it may be preferred to minimize the area occupied by the negative xVcom lines in the drive area. Accordingly, FIGS. 9A-9E illustrate an embodiment in which the number of negative xVcom lines 904 in the drive regions may be reduced. The negative xVcom lines may then be split to create an imbalance of negative xVcom lines in the sense drive regions. Portions of the yVcom lines in the drive region may be used to split the negative xVcom lines. In FIG. 9A, the majority of the drive region 908 includes four negative xVcom 904 lines that are not connected to the ITO drive plate 910 and nine positive xVcom lines 906 that are connected to the ITO drive plate 910 and may be used to drive the drive region 910. In the vicinity in which the negative xVcom lines encroach the sense region 912, they are split using the yVcom lines 914. In the sense region 912, the four negative xVcom lines may be split to form eight negative xVcom lines that cross-under the sense region 912. Further, the number of positive phase xVcom lines that cross-under the sense region 912 may be similarly reduced. Although in this example the negative xVcom lines that cross-under the sense region are doubled, the actual number of negative xVcom lines that crossunder the sense region 912 can be chosen to tune the coupling capacitance of the anti-phase negative xVcom lines in the cross-under region. By reducing the total static Csig in this region, the amount of power required to drive the drive lines may be reduced.

The number of negative xVcom lines in the drive region may be chosen to keep the resistance of the lines low enough to not adversely affect the phase of the negative xVcom lines.

Figure 9B:
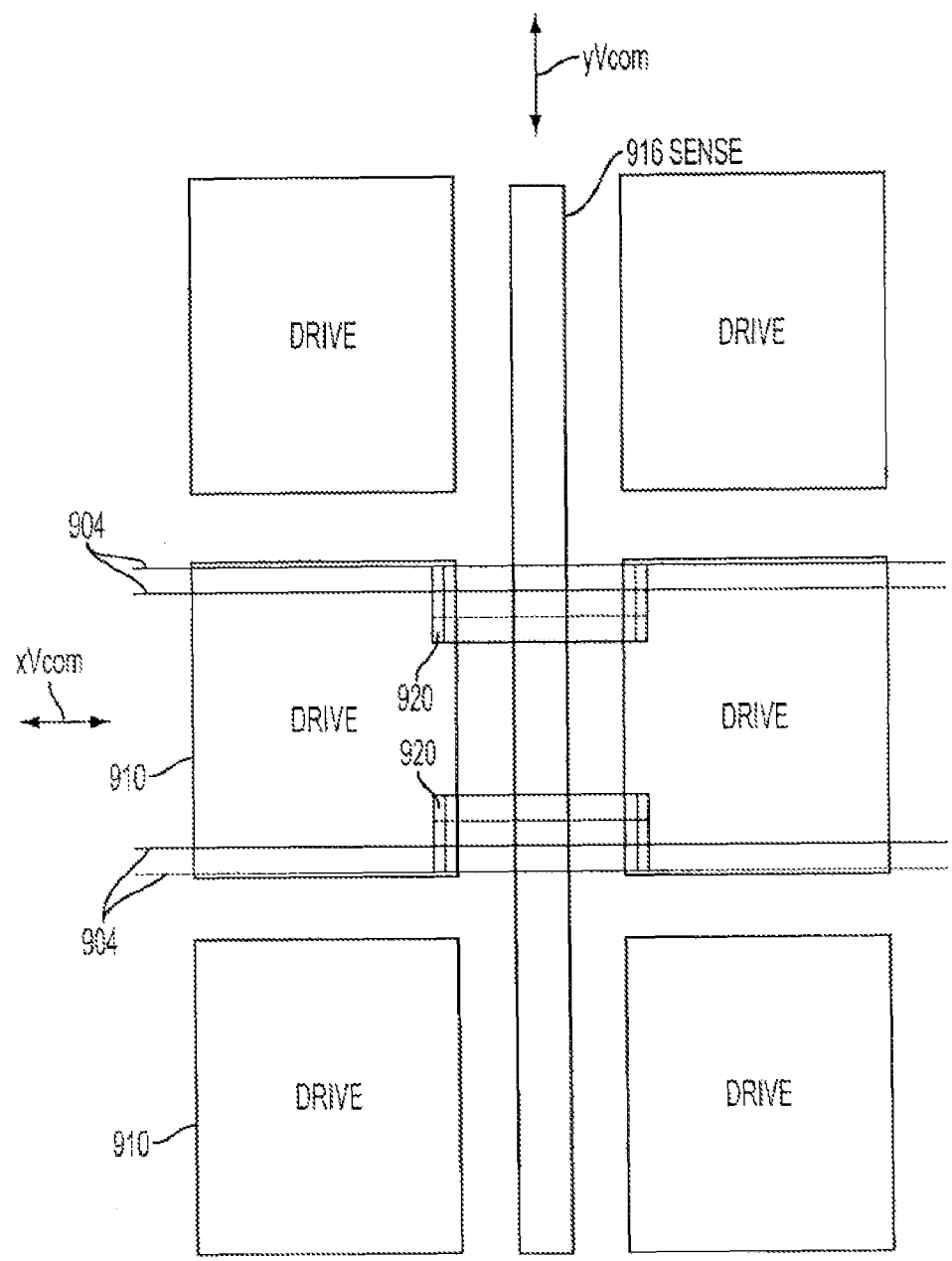
FIG. 9B illustrates the negative xVcom lines and the yVcom lines that are connected to the xVcom lines in FIG. 9A according to embodiments of the invention.
Figure 9C:
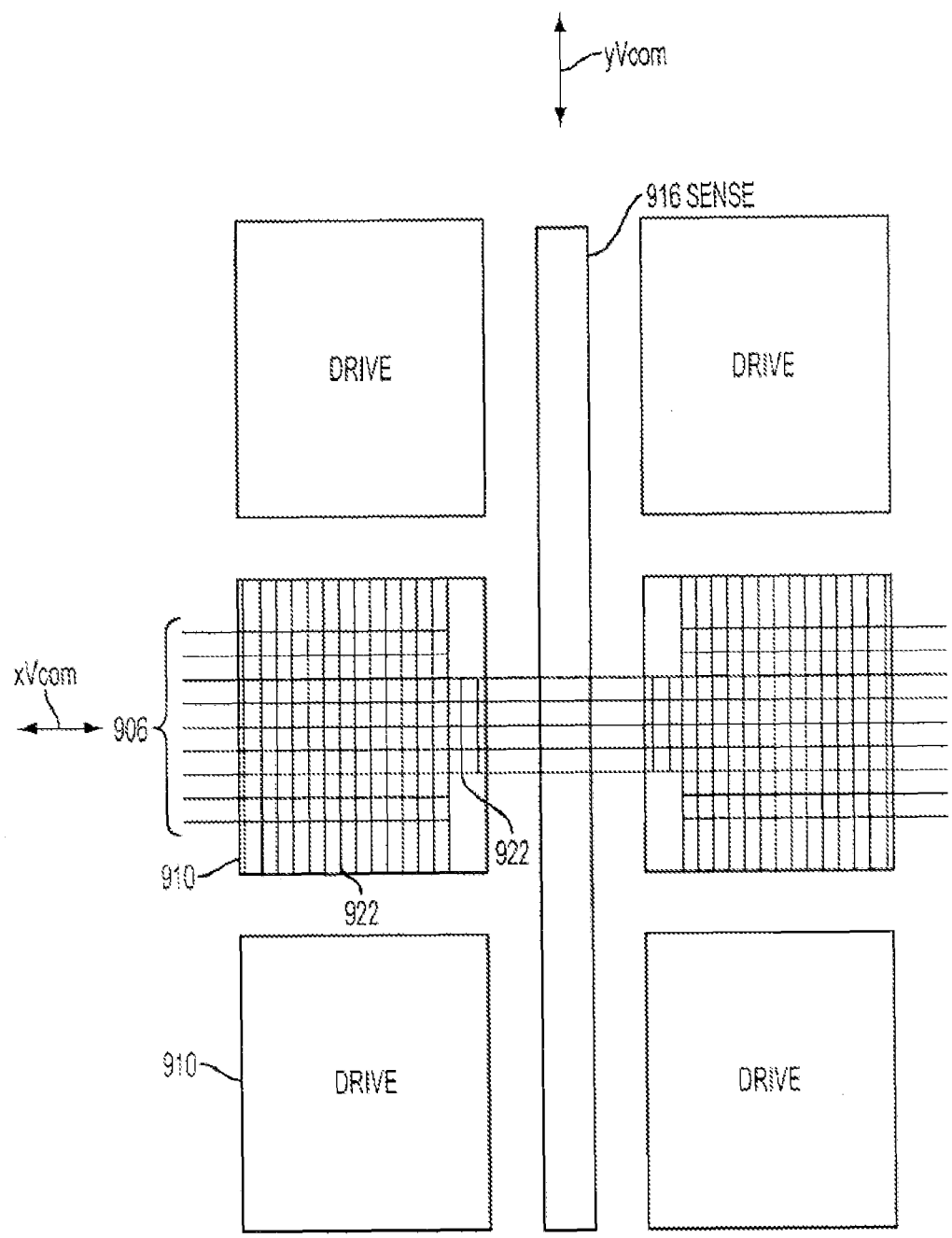
FIG. 9C illustrates the positive xVcom lines and the yVcom lines that are connected to the positive xVcom lines in FIG. 9A according to embodiments of the invention.
Figure 9D:
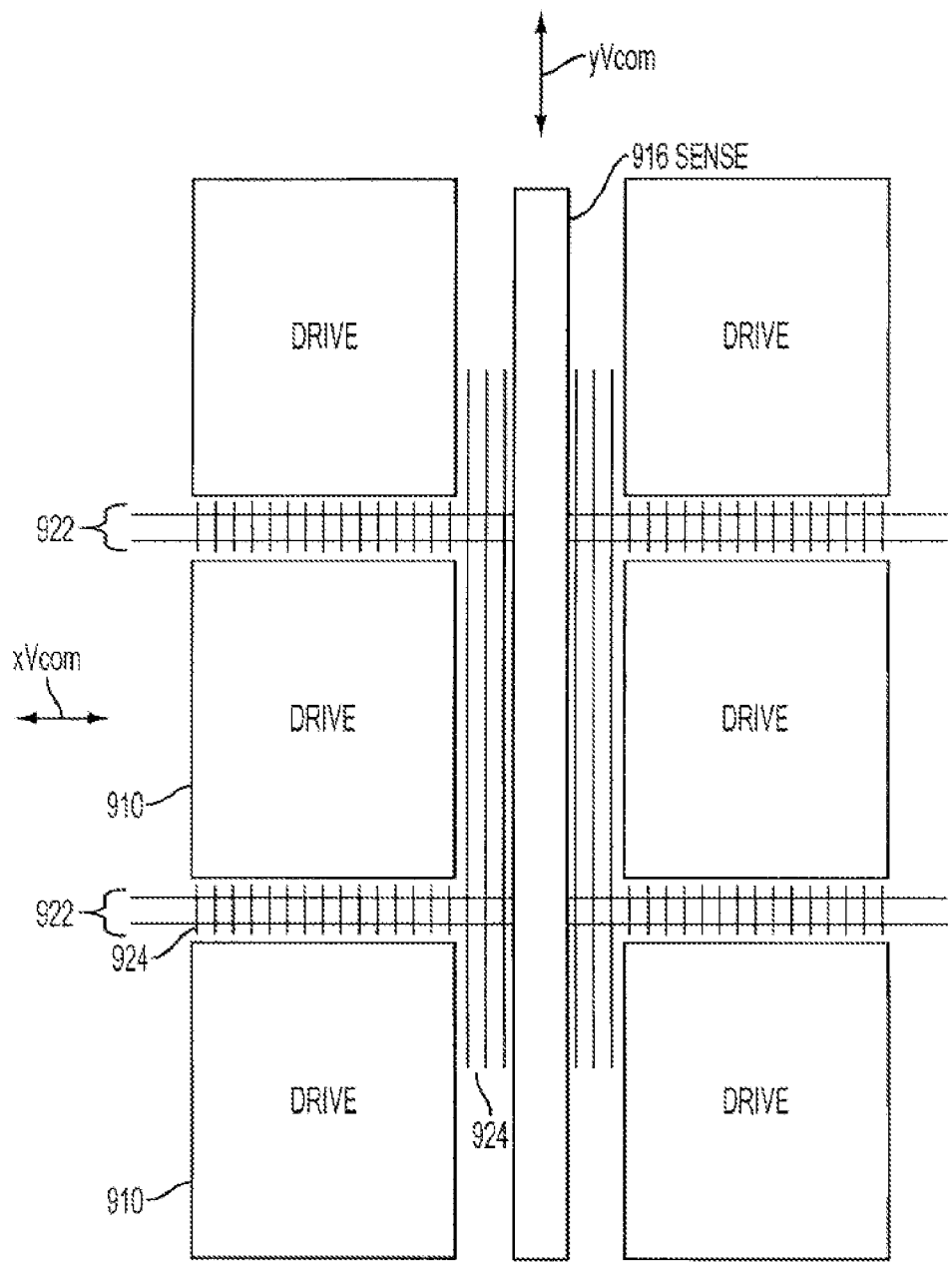
FIG. 9D illustrates the xVcom lines and the yVcom lines that are connected to ground in FIG. 9A according to embodiments of the invention.
Figure 9E:
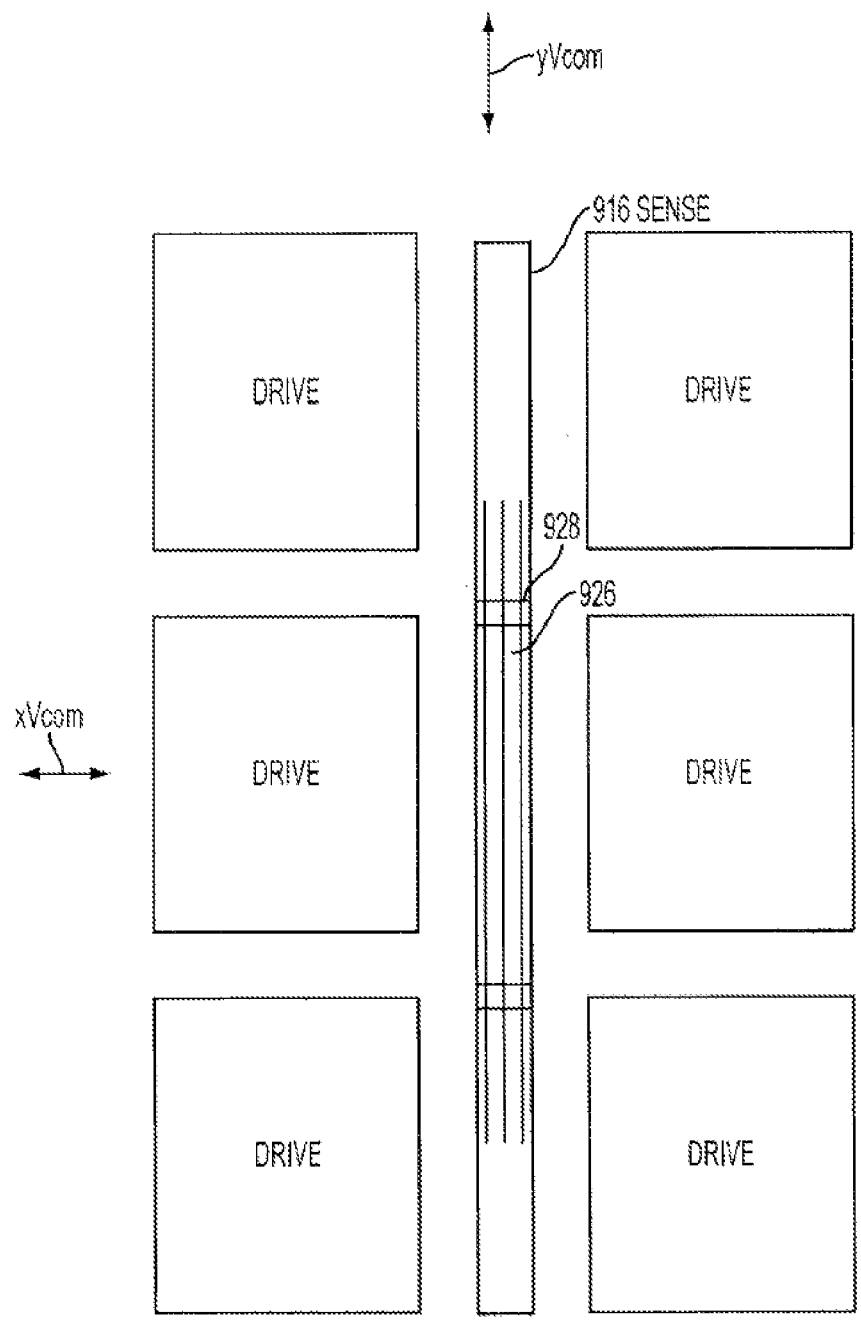
FIG. 9E illustrates the yVcom lines that are connected to the sense plate in FIG. 9A according to embodiments of the invention.

FIG. 9B illustrates the negative xVcom lines 904 and the yVcom lines 920 that may be connected to the xVcom lines. These lines are not connected to and cross-under the drive ITO plates 910 and the sense ITO plates 916. FIG. 9C illustrates the positive xVcom lines 906 and the yVcom lines 922 that may be connected to the positive xVcom lines 906. These xVcom lines 906 may be connected to drive ITO plates 910. The xVcom lines 906 are not connected to and cross-under sense ITO plates 916. FIG. 9D illustrates the xVcom lines 922 and the yVcom lines 924 that may be connected to ground. The ground may be an actual ground or a virtual ground. The ground regions may be used to isolate the different regions and reduce the parasitic capacitance formed between the different regions in the touch panel. The ground regions are not connected to either the drive ITO plates 910 or the sense ITO plates 916. FIG. 9E illustrates the yVcom lines 926 that may be connected to sense plate 916. Since xVcom lines 928 are not connected to drive source, these lines may also be connected to yVcom lines 926 and sense plate 916.

Figure 10:
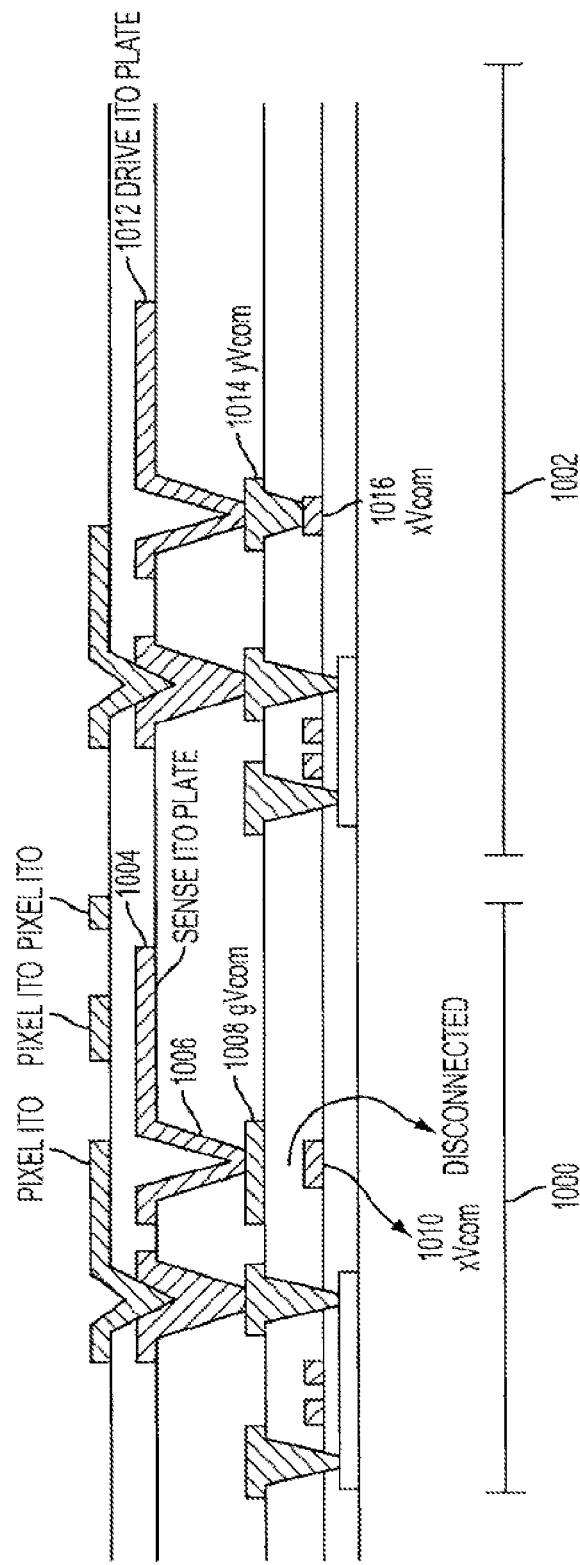
FIG. 10 illustrates a cross sectional view of a sense region and a cross sectional view of a drive region of an LCD and sensor panel according to embodiments of the invention.

FIG. 10 illustrates a cross sectional view of a sense region and a cross sectional view of a drive region of an LCD and sensor panel according to embodiments of the invention. In sense section 1000, the sense ITO plate 1004 may be connected to the yVcom line 1008 using via 1006. The xVcom line may not be electrically connected to the sense ITO plate 1010. In drive section 1002, the drive ITO plate 1012 may be electrically connected both to yVcom line 1014 and xVcom line 1016.

Figure 11:
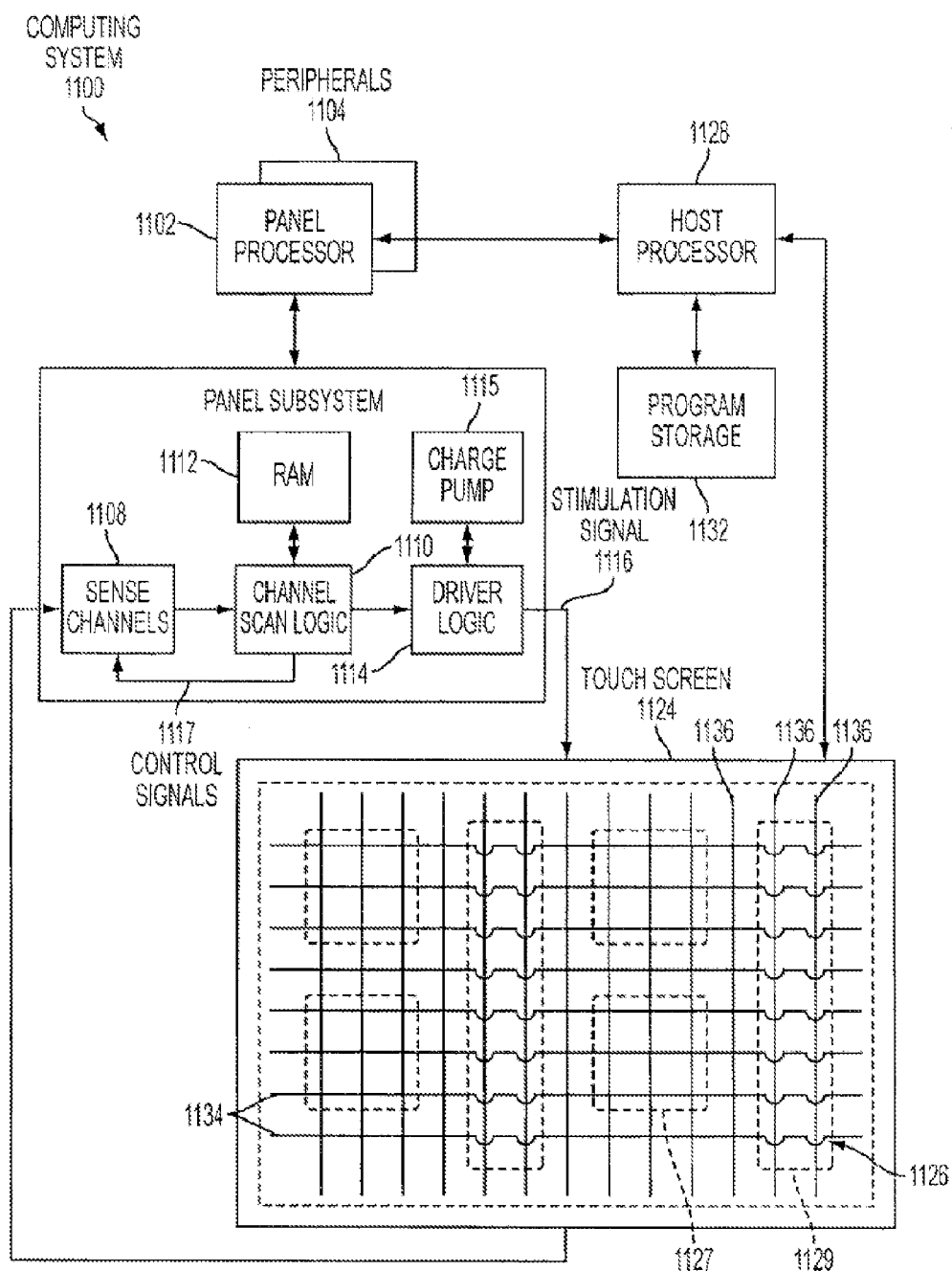
FIG. 11 illustrates an exemplary computing system having an LCD with display and touch modes according to embodiments of the invention.

FIG. 11 illustrates an exemplary computing system that can include one or more of the embodiments of the invention described herein. In the example of FIG. 11, computing system 1100 can include one or more panel processors 1102 and peripherals 1104, and panel subsystem 1106. Peripherals 1104 can include, but are not limited to, random access memory (RAM) or other types of memory or storage, watchdog timers and the like. Panel subsystem 1106 can include, but is not limited to, one or more sense channels 1108, channel scan logic (analog or digital) 1110 and driver logic (analog or digital) 1114. Channel scan logic 1110 can access RAM 1112, autonomously read data from sense channels 1108 and provide control signals 1017 for the sense channels. In addition, channel scan logic 1110 can control driver logic 1114 to generate stimulation signals 1116 at various phases that can be simultaneously applied to drive lines of touch screen 1124. Panel subsystem 1106 can operate at a low digital logic voltage level (e.g. 1.7 to 3.3V). Driver logic 1114 can generate a supply voltage greater that the digital logic level supply voltages by cascading two charge storage devices, e.g., capacitors, together to form charge pump 1015. Charge pump 1015 can be used to generate stimulation signals 1116 that can have amplitudes of about twice the digital logic level supply voltages (e.g. 3.4 to 6.6V). Although FIG. 11 shows charge pump 1015 separate from driver logic 1114, the charge pump can be part of the driver logic. In some embodiments, panel subsystem 1106, panel processor 1102 and peripherals 1104 can be integrated into a single application specific integrated circuit (ASIC).

Touch screen 1124 can include a capacitive sensing medium having a plurality of drive regions 1127 and a plurality of sense regions 1129 according to embodiments of the invention. The sense and drive regions may include a plurality of xVcom voltage lines 1134 and a plurality of yVcom voltage lines 1136. One or more of the xVcom lines may be run in a negative phase with respect to one or more of the other xVcom lines voltage lines to reduce the static capacitance of the sensor panel. Each drive region 1027 and each sense region 1029 can comprise a plurality of capacitive elements, which can be viewed as pixels 1126 and which can be particularly useful when touch screen 1124 is viewed as capturing an "image" of touch. (In other words, after panel subsystem 1106 has determined whether a touch event has been detected at each touch sensor in the touch screen, the pattern of touch sensors in the multi-touch screen at which a touch event occurred can be viewed as an "image" of touch (e.g. a pattern of fingers touching the screen)). The presence of a finger or other object near or on the touch screen can be detected by measuring changes to a signal charge present at the pixels being touched, which is a function of signal capacitance. Each sense region of touch screen 1124 can drive sense channel 1108 in panel subsystem 1106.

Computing system 1100 can also include host processor 1128 for receiving outputs from panel processor 1102 and performing actions based on the outputs that can include, but are not limited to, moving one or more objects such as a cursor or pointer, scrolling or panning, adjusting control settings, opening a file or document, viewing a menu, making a selection, executing instructions, operating a peripheral device coupled to the host device, answering a telephone call, placing a telephone call, terminating a telephone call, changing the volume or audio settings, storing information related to telephone communications such as addresses, frequently dialed numbers, received calls, missed calls, logging onto a computer or a computer network, permitting authorized individuals access to restricted areas of the computer or computer network, loading a user profile associated with a user's preferred arrangement of the computer desktop, permitting access to web content, launching a particular program, encrypting or decoding a message, and/or the like. Host processor 1128 can also perform additional functions that may not be related to panel processing, and can be coupled to program storage 1132 and touch screen 1124 such as an LCD for providing a user interface to a user of the device.

Note that one or more of the functions described above can be performed by firmware stored in memory (e.g. one of the peripherals 1104 in FIG. 11) and executed by panel processor 1102, or stored in program storage 1132 and executed by host processor 1128. The firmware can also be stored and/or transported within any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any medium that can contain or store the program for use by or in connection with the instruction execution system, apparatus, or device. The computer readable medium can include, but is not limited to, an electronic, magnetic, optical, electromagnetic, infrared, or semiconductor system, apparatus or device, a portable computer diskette (magnetic), a random access memory (RAM) (magnetic), a read-only memory (ROM) (magnetic), an erasable programmable read-only memory (EPROM) (magnetic), a portable optical disc such a CD, CD-R, CD-RW, DVD, DVD-R, or DVD-RW, or flash memory such as compact flash cards, secured digital cards, USB memory devices, memory sticks, and the like.

The firmware can also be propagated within any transport medium for use by or in connection with an instruction execution system, apparatus, or device, such as a computer-based system, processor-containing system, or other system that can fetch the instructions from the instruction execution system, apparatus, or device and execute the instructions. In the context of this document, a "transport medium" can be any medium that can communicate, propagate or transport the program for use by or in connection with the instruction execution system, apparatus, or device. The transport readable medium can include, but is not limited to, an electronic, magnetic, optical, electromagnetic or infrared wired or wireless propagation medium.

It is to be understood that the touch screen may not be limited to touch, as described in FIG. 11, but may be a proximity screen or any other screen switchable between a display mode and a touch mode according to embodiments of the invention. In addition, the touch sensor panel described herein can be either a single-touch or a multi-touch sensor panel.

Figure 12A:
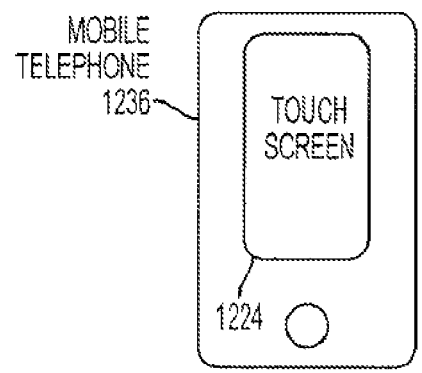
FIG. 12a illustrates an exemplary mobile telephone having an LCD with display and touch modes according to embodiments of the invention.

FIG. 12a illustrates an exemplary mobile telephone 1236 that can include touch screen 1224 and other computing system blocks that can be utilized for configuring data lines of the touch screen during a touch mode of the telephone.

Figure 12B:
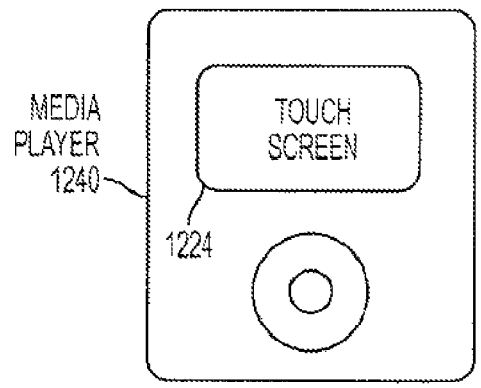
FIG. 12b illustrates an exemplary digital media player having an LCD with display and touch modes according to embodiments of the invention.

FIG. 12b illustrates an exemplary digital media player 1140 that can include touch screen 1224 and other computing system blocks that can be utilized for configuring data lines of the touch screen during a touch mode of the media player.

Figure 12C:
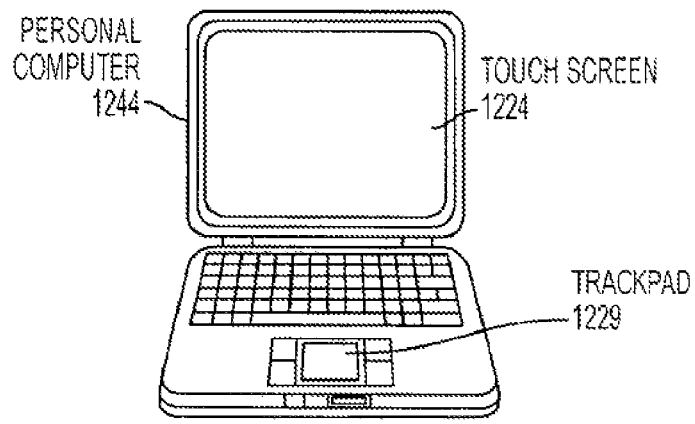
FIG. 12c illustrates an exemplary personal computer having an LCD with display and touch modes according to embodiments of the invention.

FIG. 12c illustrates an exemplary personal computer 1244 that can include touch screen 1224, touch sensor panel (trackpad) 1226, and other computing system blocks that can be utilized for configuring data lines of the touch screen during a touch mode of the personal computer.

The mobile telephone, media player, and personal computer of FIGS. 12a, 12b and 12c can be thinner, lighter, more efficient, and cost and power saving with an LCD having display and touch modes with configurable data lines according to embodiments of the invention. Although embodiments of this invention have been fully described with reference to the accompanying drawings, it is to be noted that various changes and modifications will become apparent to those skilled in the art. Such changes and modifications are to be understood as being included within the scope of embodiments of this invention as defined by the appended claims.

What is claimed is:

1. A touch sensitive panel comprising:
a first voltage line driven at a first phase;
a second voltage line driven at a second phase that is different than the first phase;
a first and second drive region coupled to the first voltage line; and
a sense region disposed between the first and second drive regions along a first direction;
wherein the first voltage line and the second voltage line cross the sense region;
each of the first and second drive regions comprising a first plurality of display pixels having pixel electrodes and common electrodes, the common electrodes receiving a stimulation voltage along the first voltage line during a touch sensing mode of operation;
the sense region comprising a second plurality of display pixels having pixel electrodes and common electrodes, the common electrodes of the sense region connected to touch sensing circuitry during the touch sensing mode of operation;
the pixel electrodes of the first and second drive region and the sense region receiving a data signal during a display mode of operation; and
wherein the first and second phases of the first and second voltage lines reduce static capacitance in the sense region as compared to a configuration in which the second voltage lines are not utilized.

2. The touch sensitive panel of claim 1, wherein the touch sensitive panel comprises a touch screen.

3. The touch sensitive panel of claim 1, wherein the second phase is opposite the first phase.

4. The touch sensitive panel of claim 1, wherein the second voltage lines cross the drive region.

5. The touch sensitive panel of claim 4, wherein the second voltage line is one of a plurality of second voltage lines, a number of second voltage lines that cross the drive region is less than a number of second voltage lines that cross the sense region.

6. The touch sensitive panel of claim 1, wherein all of the common electrodes in the first drive region are electrically connected together, and all of the common electrodes in the second drive region are electrically connected together.

7. The touch sensitive panel of claim 6, comprising a conductive layer that electrically connects all the common electrodes in the first drive region and in the second drive region.

8. The touch sensitive panel of claim 1, further comprising a plurality of third voltage lines connected to the sense region.

9. A method of reducing static capacitance in a touch panel having a first and second drive region positioned along a first direction with a sense region disposed therebetween, each of the first and second drive regions comprising a first plurality of display pixels having pixel electrodes and common electrodes, the common electrodes receiving a stimulation voltage along a first voltage line during a touch sensing mode of operation;
the sense region comprising a second plurality of display pixels having pixel electrodes and common electrodes, the common electrodes of the sense region connected to touch sensing circuitry during the touch sensing mode of operation;
the pixel electrodes of the first and second drive region and the sense region receiving a data signal during a display mode of operation;
the method comprising: driving the first voltage line at a first phase;
driving a second voltage line at a second phase that is different than the first phase;
wherein the first voltage line and the second voltage line cross the sense region; and wherein the first and second phases of the first and second voltage lines reduce static capacitance in the sense region as compared to a configuration in which the second voltage lines are not utilized.

10. The method of claim 9, wherein the second voltage line crosses-under the first and second drive regions.

11. The method of claim 10, wherein the second voltage line is one of a plurality of second voltage lines, a number of second voltage lines that cross-under the drive region is less than the number of second voltage lines that cross the sense region.

12. The method of claim 9, wherein all of the common electrodes in the first drive region are electrically connected together, and all of the common electrodes in the second drive region are electrically connected together.

13. The method of claim 12, comprising a conductive layer that electrically connects all the common electrodes in the first drive region and in the second drive region.

14. The method of claim 9, wherein the second phase is opposite the first phase.

15. The method of claim 9, further comprising a plurality of third voltage lines connected to the sense region.

16. A mobile telephone comprising
a first voltage line driven at a first phase;
a second voltage line driven at a second phase that is different than the first phase;
a first and second drive region coupled to the first voltage line; and
a sense region disposed between the first and second drive regions along a first direction;
wherein the first voltage line and the second voltage line cross the sense region;
each of the first and second drive regions comprising a first plurality of display pixels having pixel electrodes and common electrodes, the common electrodes receiving a stimulation voltage along the first voltage line during a touch sensing mode of operation;
the sense region comprising a second plurality of display pixels having pixel electrodes and common electrodes, the common electrodes of the sense region connected to touch sensing circuitry during the touch sensing mode of operation;
the pixel electrodes of the first and second drive region and the sense region receiving a data signal during a display mode of operation; and
wherein the first and second phases of the first and second voltage lines reduce static capacitance in the sense region as compared to a configuration in which the second voltage lines are not utilized.

17. A mobile telephone comprising a touch screen comprising:
a first voltage line driven at a first phase;
a second voltage line driven at a second phase that is different than the first phase;
a first and second drive region coupled to the first voltage line; and
a sense region disposed between the first and second drive regions along a first direction;
wherein the first voltage line and the second voltage line cross the sense region;
each of the first and second drive regions comprising a first plurality of display pixels having pixel electrodes and common electrodes, the common electrodes receiving a stimulation voltage along the first voltage line during a touch sensing mode of operation;
the sense region comprising a second plurality of display pixels having pixel electrodes and common electrodes, the common electrodes of the sense region connected to touch sensing circuitry during the touch sensing mode of operation;
the pixel electrodes of the first and second drive region and the sense region receiving a data signal during a display mode of operation; and
wherein the first and second phases of the first and second voltage lines reduce static capacitance in the sense region as compared to a configuration in which the second voltage lines are not utilized.

* * * * *